United States Patent [19]

Cave et al.

[11] 4,366,445
[45] Dec. 28, 1982

[54] FLOATING NPN CURRENT MIRROR

[75] Inventors: David L. Cave, Tempe, Ariz.; Walter R. Davis, Sunnyvale, Calif.

[73] Assignee: Motorola, Inc., Schaumburg, Ill.

[21] Appl. No.: 238,800

[22] Filed: Feb. 27, 1981

[51] Int. Cl.³ .......................... H03F 3/45; G05F 3/20
[52] U.S. Cl. .................................. 330/257; 330/288; 323/315
[58] Field of Search ................ 330/257, 288; 323/315, 323/316

[56] References Cited

U.S. PATENT DOCUMENTS 3,840,819 10/1974 Steckler ............................. 330/257
4,308,496 12/1981 Nagano ............................. 323/315

FOREIGN PATENT DOCUMENTS 2422288 12/1979 France .............................. 330/257

Primary Examiner—James B. Mullins
Assistant Examiner—Gene Wan
Attorney, Agent, or Firm—William E. Koch

[57] ABSTRACT

An amplifier circuit is disclosed which utilizes a differential-to-single ended converter having a floating current mirror. The amplifier includes a differential driving circuit having first and second differential output terminals which are respectively connected to first and second current supplies and an output transistor. The current mirror includes a diode-connected transistor having a base-to-emitter junction connected in parallel with the base-to-emitter junction of a further transistor. The base electrode of the diode-connected transistor is connected to one of the differential output terminals and the collector electrode of the further transistor is connected to the other differential output terminal. The emitter electrodes of the diode-connected transistor and of the further transistor are adapted to receive a voltage having a fixed magnitude which enables the transistors of the current mirror to have the same conductivity type as the transistors of the differential driving circuit and the output transistor.

8 Claims, 1 Drawing Figure

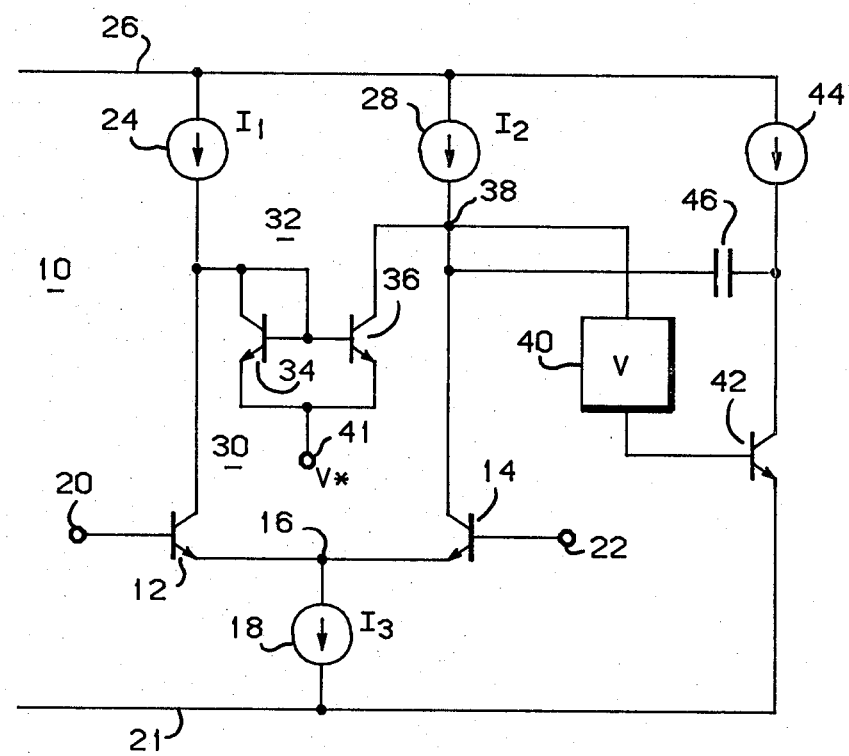

FLOATING NPN CURRENT MIRROR

BACKGROUND OF THE INVENTION

1. Field of the Invention

This invention relates generally to current mirror circuits and more particularly to such circuits which are suitable for manufacture in bipolar integrated circuit form. 2. Description of the Prior Art Some early types of operational amplifiers, for instance, include first and second differentially connected NPN transistors having a PNP current mirror functioning as a differential-to-single ended converter connected between the collectors thereof. The current mirror includes a diode-connected PNP transistor and a further PNP transistor. The diode-connected transistor has an emitter electrode connected to a positive supply conductor, a collector electrode connected to the base electrode thereof and to the collector electrode of the first differential NPN transistor. The further PNP transistor has an emitter electrode connected to the positive supply conductor, a base electrode connected to the base electrode of the diode-connected transistor, and a collector electrode connected to the collector electrode of the second differential NPN transistor. The purpose of the current mirror in this configuration is to convert the differential output signals of the differential pair of NPN transistors into a single ended signal and to enhance the common mode rejection ratio of the differential pair.

The above-described amplifier also includes an output or second stage PNP transistor with an emitter electrode connected to the positive supply conductor, a base electrode connected to the collector electrode of the second differential NPN transistor and a collector electrode connected through a current source or supply to the negative supply conductor. Another current supply is connected between emitter electrodes of the first and second differentially connected NPN transistors and the negative supply conductor. A frequency compensation capacitor is connected from the collector electrode of the output PNP transistor to the collector electrode of the second NPN transistor and the output signal is taken from the collector electrode of the PNP output transistor.

The process and geometry generally utilized in manufacturing the PNP transistors commonly used in such bipolar integrated circuitry results in such devices having poor frequency responses. Thus, the PNP differential-to-single ended converter utilized in the above-described amplifier tends to have a poor frequency response which results in phase and stability problems. Hence, the PNP second stage of the above-described amplifier also has a poor frequency response which is difficult to stabilize by the compensation capacitor connected between the collector and base thereof.

As the requirements for improved frequency response increased, it became apparent that the second stage transistor of such integrated amplifier circuits must be of an NPN configuration to facilitate improved frequency response and stability. Thus, the conductivity types of the transistors and the supply polarities of the above-described amplifier were reversed. Accordingly, PNP differentially connected input transistors having emitter electrodes connected through a current supply to the positive supply conductor are presently utilized. An NPN current mirror is connected between the collector electrodes of the differential transistors and the negative supply. An NPN output transistor is coupled between the current mirror and the amplifier output terminal. A further current supply is connected between the positive supply conductor and the collector electrode and a frequency compensating capacitor is connected between the collector electrode and base electrode of the output NPN transistor. This particular improved amplifier configuration is used in many present day applications because the frequency compensating capacitor effectively frequency compensates the NPN output transistor. Unfortunately, the frequency response of the amplifier configuration is generally limited to below 1 megahertz (MHz) because of the undesirably limited frequency responses of the PNP differential input transistors.

SUMMARY OF THE INVENTION

An object of the invention is to provide a current mirror for use in monolithic integrated circuits.

A further object of the invention is to provide a differential-to-single ended converter for use in an amplifier circuit suitable for manufacture in monolithic integrated circuit form which has a high frequency response and a high common mode range.

Another object of the invention is to provide a differential-to-single ended converter for use in an integrated circuit amplifier which has the same conductivity type transistors as the input and output transistors of the amplifier.

Briefly, the invention relates to a current mirror circuit for providing an output current which varies in a predetermined manner with the magnitude of an input current. The current mirror includes a diode-connected input transistor of a particular conductivity type and an output transistor of the same conductivity type. The base-to-emitter junctions of the input transistor and output transistor are connected in parallel. The emitter electrodes of both transistors are adapted to receive a direct current voltage of a constant magnitude. This enables the conductivities of the current mirror transistors to be the same as the conductivities of differentially-connected driving transistors and of an amplifier output transistor, for instance, to improve frequency stability.

BRIEF DESCRIPTION OF THE DRAWINGS

The sole FIGURE is a partial block and schematic diagram of an amplifier including a differential-to-single ended converter having a current mirror in accordance with the invention.

DETAILED DESCRIPTION OF THE PREFERRED EMBODIMENT

Amplifier circuit 10 of FIG. 1 includes differentially-connected NPN input or driving transistors 12 and 14. The emitter electrodes of transistors 12 and 14 are connected through node 16 to constant current supply or sink 18, which is connected to negative supply conductor 21. The base electrodes of transistors 12 and 14 can receive a differential driving signal applied between input terminals 20 and 22 or one of these input terminals can be connected to an alternating current (ac) ground in a known manner so that a single-ended input signal can drive the other input terminal. In either case a differential output signal is created between the collector electrodes of transistors 12 and 14.

Constant current supply 24 is connected between positive voltage supply conductor 26 and the collector electrode of transistor 12. Similarly, constant current supply 28 is connected between positive power supply conductor 26 and the collector electrode of transistor 14. Current supplies 24 and 28 enable input stage 30 including transistors 12 and 14 to have a high gain.

Current mirror circuit 32 includes diode connected NPN transistor 34 and mirror output NPN transistor 36. The emitter electrode and base electrodes of transistors 34 and 36 are connected together. The collector electrode of transistor 34 is connected to the base thereof, to the output terminal of current supply 24 and to the collector electrode of transistor 12. The collector electrode of mirror output transistor 36 is connected to the output terminal of current supply 28 at node 38 and to the collector electrode of transistor 14. A direct current (dc) reference potential is applied to terminal 41 which is connected to the emitter electrodes of transistors 34 and 36. This potential may be provided by circuitry known in the art. Accordingly, the emitter electrodes of transistors 34 and 36 are said to be "floating" rather than grounded as in many prior art configurations. This particular connection performs an important role in allowing differentially connected NPN transistors 12 and 14 and NPN current mirror transistors 34 and 36 to all have the same conductivity type.

Output terminal 38 of current mirror 32 is coupled through voltage level shift circuit 40 to the base electrode of NPN second stage output transistor 42. Circuit 40 may be comprised of a zener diode or other known level shifting circuit. Output constant current supply 44 is connected between positive supply conductor 26 and the collector electrode of transistor 42. Negative supply conductor 21 is connected to the emitter electrode of transistor 42. Pole splitting or frequency stabilizing capacitor 46 is coupled between the collector electrode of transistor 42 and output terminal 38 of floating current mirror 32. Capacitor 46 provides pole-splitting or frequency compensation of the output stage including NPN transistor 42 in a known manner.

During quiescent operation, the sum of the magnitudes of the currents $I_1$, $I_2$ of respective current supplies 24, 28 exceeds the magnitudes of the current, $I_3$ set in transistors 12 and 14 by constant current sink 18. Generally, current supplies 24 and 28 will provide currents of equal instant magnitudes. The excess current which is the difference between the magnitude of the currents drawn by transistor 12 and the magnitude of the current supplied by supply 24, is used to bias diode connected transistor 34, which in turn biases the current mirror output transistor 36. The current from current supply 28 not drawn by transistors 14 and 36 can be utilized to bias level shifting network 40 and transistor 42.

Since the base-to-emitter junction of transistor 34 is connected in parallel with the base-to-emitter junction of transistor 36, the base-to-emitter voltage of transistor 34 will tend to drive transistor 36 to conduct a current having a magnitude which increases when the current through transistor 34 increases and which decreases when the current through transistor 34 decreases. If transistors 34 and 36 have matched geometries, the collector current of transistor 36 will very closely match or "mirror" the collector current of transistor 34, assuming that errors caused by the base currents can be neglected. Generally, since the betas of NPN transistors manufactured by present-day monolithic integrated circuit processes are relatively high, the base current errors of circuit 32 can be neglected for most practical purposes. In any event, such errors are much less than the errors which would be caused by PNP transistors manufactured by present day monolithic integrated circuit processes which generally have comparatively lower betas.

During dynamic operation, assume that transistor 12 is rendered more conductive than transistor 14 by an input signal. As a result, an increased amount of current will be drawn by the collector of transistor 12 from current supply 24. This reduces the magnitude of the base current of transistor 34. Thus, transistor 34 conducts less current between its base-to-emitter junction, and the base-to-emitter voltage thereof decreases. This results in the base-to-emitter voltage of transistor 36 being decreased which causes transistor 36 to be less conductive thereby increasing the collector voltage thereof. Consequently, the potential at output terminal 38 of differential-to-single ended converter 32 increases. Since transistor 12 is being rendered more conductive, transistor 14 is being rendered less conductive which causes the collector voltage to increase which also tends to increase the potential at terminal 38.

Alternatively, if transistor 12 is rendered less conductive and transistor 14 more conductive, then more current from current supply 24 is applied to the base of transistor 34, thereby rendering transistor 34 more conductive which increases the base-to-emitter voltage thereof to increase the base-to-emitter voltage of transistor 36. Consequently, transistor 36 tends to be rendered more conductive and "mirror" or duplicate the current being conducted by transistor 34. As a result the voltage at terminal 38 tends to decrease because the collector voltage of transistor 36 is decreasing and because the collector voltage of transistor 14 is decreasing. By ratioing or scaling in a known manner the base-to-emitter areas of transistors 34 and 36, the instantaneous magnitude of the current of transistor 36 can be a selected fraction or multiple of the instantaneous magnitude of the current of transistor 34.

Amplifier 10 has a large common mode range because the base electrodes of transistors 12 and 14 can be taken dc-wise almost to the potential on negative supply conductor 21 or almost to the positive potential on positive conductor 41 which may be a potential near the potential on conductor 26 and still amplifier 10 will amplify an alternating current (a.c.) signal.

Thus, current mirror 32 has been described which can be utilized in a differential-to-single ended converter driven by a differential driving source such as transistors 12 and 14 to provide a single-ended output at terminal 38, for instance. Current mirror 32 has a simple configuration which can also be used in monolithic integrated circuit applications not involving differential-to-single ended conversion where it is desired that the instantaneous magnitude of an output current track the instantaneous magnitude of an input current. When employed in amplifier 10, current mirror 32 enables second stage output transistor 42, differential driving transistors 12 and 14, and transistors 34, 36 of differential-to-single ended converter 32 to all have the same conductivity type. In the case of presently manufactured bipolar linear IC's, the preferred conductivity type for these transistors is NPN because of the superior electrical characteristics of NPN transistors. Thus, current mirror 32 enables amplifer 10 to have a high frequency response on the order of several megahertz while maintaining a large common mode range.

We claim:

1. A current mirror circuit having a first voltage conductor, for providing an output current which varies in a predetermined manner to an input current, said current mirror circuit coupled to an operational amplifier having a differential pair of transistors comprising a first NPN transistor and a second NPN transistor, said first and second NPN transistors having a collector, base, and emitter, said emitters both coupled together and to a second voltage conductor, the base of said first NPN transistor coupled to a first input signal conductor and the base of said second NPN transistor coupled to a second input signal conductor, the collector of said first NPN transistor coupled to a third voltage conductor and the collector of said second NPN transistor coupled to said third voltage conductor, said current mirror comprising:
 a third NPN transistor having a collector, base, and emitter, the collector coupled to both the collector of said first NPN transistor and the base of said third NPN transistor; and
 a fourth NPN transistor having a collector, base, and emitter, the collector coupled to the collector of said second NPN transistor, the base coupled to the base of said third NPN transistor, the emitter coupled to both the emitter of said third NPN transistor and said first voltage conductor, wherein said first voltage conductor is maintained at a voltage between the voltages of said second and said third voltage conductors.

2. The current mirror circuit according to claim 1 further including a fifth NPN transistor for providing an output, having a collector, base, and emitter, said emitter coupled to said second voltage conductor, said collector coupled to said third voltage conductor and said base coupled to the collector of said second NPN transistor.

3. The current mirror circuit according to claim 2 further including a capacitor coupled between the collectors of said second NPN transistor and said fifth NPN transistor.

4. The current mirror circuit according to claim 2 further including a level shift means coupled between the collector of said second NPN transistor and the base of said fifth NPN transistor.

5. An operational amplifier having a first, a second, and a third voltage conductor and a first and a second input signal conductor, for providing an output signal responsive to an input signal, said amplifier comprising:
 a first NPN transistor having a collector, base, and emitter, said collector coupled to said third voltage conductor, said base coupled to said first input signal conductor, and said emitter coupled to said second voltage conductor;
 a second NPN transistor having a collector, base and emitter, said collector coupled to said third voltage conductor, said base coupled to said second input signal conductor, and said emitter coupled both to the emitter of said first NPN transistor and said second voltage conductor;
 a third NPN transistor having a collector, base, and emitter, the collector coupled to both the collector of said first NPN transistor and the base of said third NPN transistor; and
 a fourth NPN transistor having a collector, base, and emitter, the collector coupled to the collector of said second NPN transistor, the base coupled to the base of said third NPN transistor, the emitter coupled to both the emitter of said third NPN transistor and said first voltage conductor, wherein said first voltage conductor is maintained at a voltage between the voltages of said second and said third voltage conductors.

6. The operational amplifier according to claim 5 further comprising a fifth NPN transistor for providing an output, having a collector, base, and emitter, said emitter coupled to said second voltage conductor, said collector coupled to said third voltage conductor and said base coupled to the collector of said second NPN transistor.

7. The operational amplifier according to claim 6 further comprising a capacitor coupled between the collectors of said second NPN transistor and said fifth NPN transistor.

8. The operational amplifier according to claim 6 further comprising a level shift means coupled between the collector of said second NPN transistor and the base of said fifth NPN transistor.

* * * * *